United States Patent [19]

Holonyak, Jr. et al.

[11] Patent Number: 4,817,103
[45] Date of Patent: Mar. 28, 1989

[54] SEMICONDUCTOR LIGHT EMITTING DEVICE WITH STACKED ACTIVE REGIONS

[75] Inventors: Nick Holonyak, Jr.; Dennis Deppe, both of Urbana, Ill.

[73] Assignee: University of Illinois, Urbana, Ill.

[21] Appl. No.: 915,583

[22] Filed: Oct. 6, 1986

[51] Int. Cl.$^4$ ................................................. H01S 3/19
[52] U.S. Cl. ......................................... 372/45; 357/16; 357/17; 372/46; 372/50
[58] Field of Search ...................... 357/16, 17; 372/44, 372/45, 46, 50

[56] References Cited

U.S. PATENT DOCUMENTS

| | | | |
|---|---|---|---|
| 4,378,255 | 3/1983 | Holonyak et al. | 148/1.5 |
| 4,511,408 | 4/1985 | Holonyak | 148/1.5 |
| 4,577,321 | 3/1986 | Carney et al. | 372/45 |
| 4,594,603 | 6/1986 | Holonyak, Jr. | 372/46 |
| 4,627,065 | 12/1986 | Logan et al. | 372/50 |
| 4,639,275 | 1/1987 | Holonyak | 148/1.5 |
| 4,700,353 | 10/1987 | Van Gieson et al. | 372/50 |

OTHER PUBLICATIONS

Deppe et al., "Low Threshold Disorder-Defined Buried Heterostructure Al$_x$Ga$_{1-x}$As-GaAs Quantum Well Lasers", J. Appl. Phys., 58, 1985.

G. Thompson, "Physics of Semiconductor Laser Devices" J. Wiley & Sons, 1984.

D. Botez, "Laser Diodes are Power Packed", IEEE Spectrum, Jun., 1985.

Y. Yang et al., "Transverse Junction Stripe Laser with a Lateral Heterobarrier by Diffusion Enhanced Alloy Disordering", Appl. Phys. Lett. 49, Oct. 6, 1986.

Primary Examiner—William L. Sikes
Assistant Examiner—Georgia Y. Epps
Attorney, Agent, or Firm—Martin M. Novack

[57] ABSTRACT

A layered structure is disclosed which includes a stack of alternating active regions and confining layers arranged so that each active region is sandwiched between confining layers. Each active region preferably includes one or more quantum well layers disposed between barrier layers. Carrier injection means are provided for injecting carriers into the layered structure to cause phase locked light emission from the active regions. In this manner, an output laser beam can be obtained that has substantially improved far field divergence as compared, for example, to a beam emanating from a single active region.

28 Claims, 8 Drawing Sheets

… … …

SEMICONDUCTOR LIGHT EMITTING DEVICE WITH STACKED ACTIVE REGIONS

This invention was made with Government support, and the Government has certain rights in this invention.

BACKGROUND OF THE INVENTION

This invention relates to semiconductor devices and, more particularly, to semiconductor light emitting devices, such as lasers, which have improved far field divergence and improved power capability.

A typical semiconductor laser employs a single-stripe geometry if intended for low power (low threshold) applications, and multiple stripes for coupled-stripe higher power operation. In either case the thin horizontal ("flat") geometry of the semiconductor laser required for low threshold and stable fundamental mode operation leads to a relatively large vertical ($\theta_\perp$) beam width. To reduce the vertical beam spread requires some method of vertically expanding the optical mode. A large optical cavity expands the waveguiding region but can introduce problems in ensuring zero-order mode operation. Enlarging the active region, however, reduces the likelihood of higher order transverse modes in a waveguide of fixed size.

Accordingly, there is a need for development of a practical semiconductor laser device which has less far field divergence without unduly sacrificing other laser properties. It is among the objects of the present invention to address this need.

It is also among the objects of the present invention to provide semiconductor light emitters, particularly lasers, having improved power output and which can be configured in two dimensional arrays.

SUMMARY OF THE INVENTION

In the present invention there is provided a layered structure including a stack of alternating active regions and confining layers arranged so that each active region is sandwiched between confining layers. Each active region preferably includes one or more quantum well layers disposed between barrier layers. Carrier injection means are provided for injecting carriers into the layered structure to cause phase locked light emission from the active regions. In this manner, an output laser beam can be obtained that has substantially improved far field divergence as compared, for example, to a beam emanating from a single active region.

In one form of the invention, the confining layers comprise semiconductor material of one conductivity type, and the active regions include semiconductor material having a lower bandgap than the bandgap of the confining layer material. A pair of spaced apart edge regions, used for carrier injection, extend through the stack of active regions and confining layers so as to respectively contact opposing ends of the layers of the stack. The edge injection regions are of a second semiconductor type and have a bandgap that is higher than that of said semiconductor material of the active regions. In an embodiment set forth, the edge injection regions are obtained by diffusion of silicon which, inter alia, disorders the material of the active regions. When a potential is applied between the injection regions and the confining layers carriers are injected into the edges of the active regions from the edge injection regions.

In another form of the invention, the confining layers are of alternating semiconductor type, so that each active region has a p-type confining layer on one side thereof and an n-type confining layer on the other side thereof. In this form of the invention, the two spaced apart edge regions are of opposite conductivity type. For example, one edge region is formed by diffusion of silicon, which renders this edge region n-type, and the other edge region is formed by diffusion of zinc, which renders this edge region p-type. In operation of this form of the invention, when a potential is applied between the two edge regions, each of the edge regions couples carriers (electron or holes, as the case may be) to those of the confining layers having the same conductivity type as the particular edge region. In this manner, with regard to each active region, carriers are injected into the confining layers on both sides of each said active region, with the result that a relatively high power light output can be obtained. Also, due to the extent of the source in the direction perpendicular to the planes of the layers, substantial improvements in laser beam far field divergence can be obtained.

In a further form of the invention, a two dimensional array of active regions is achieved by employing side-by-side stacked devices of the type described.

Further features and advantages of the invention will become more readily apparent from the following detailed description when taken in conjunction with the accompanying drawings.

DESCRIPTION OF THE PREFERRED EMBODIMENTS

Figure 1:
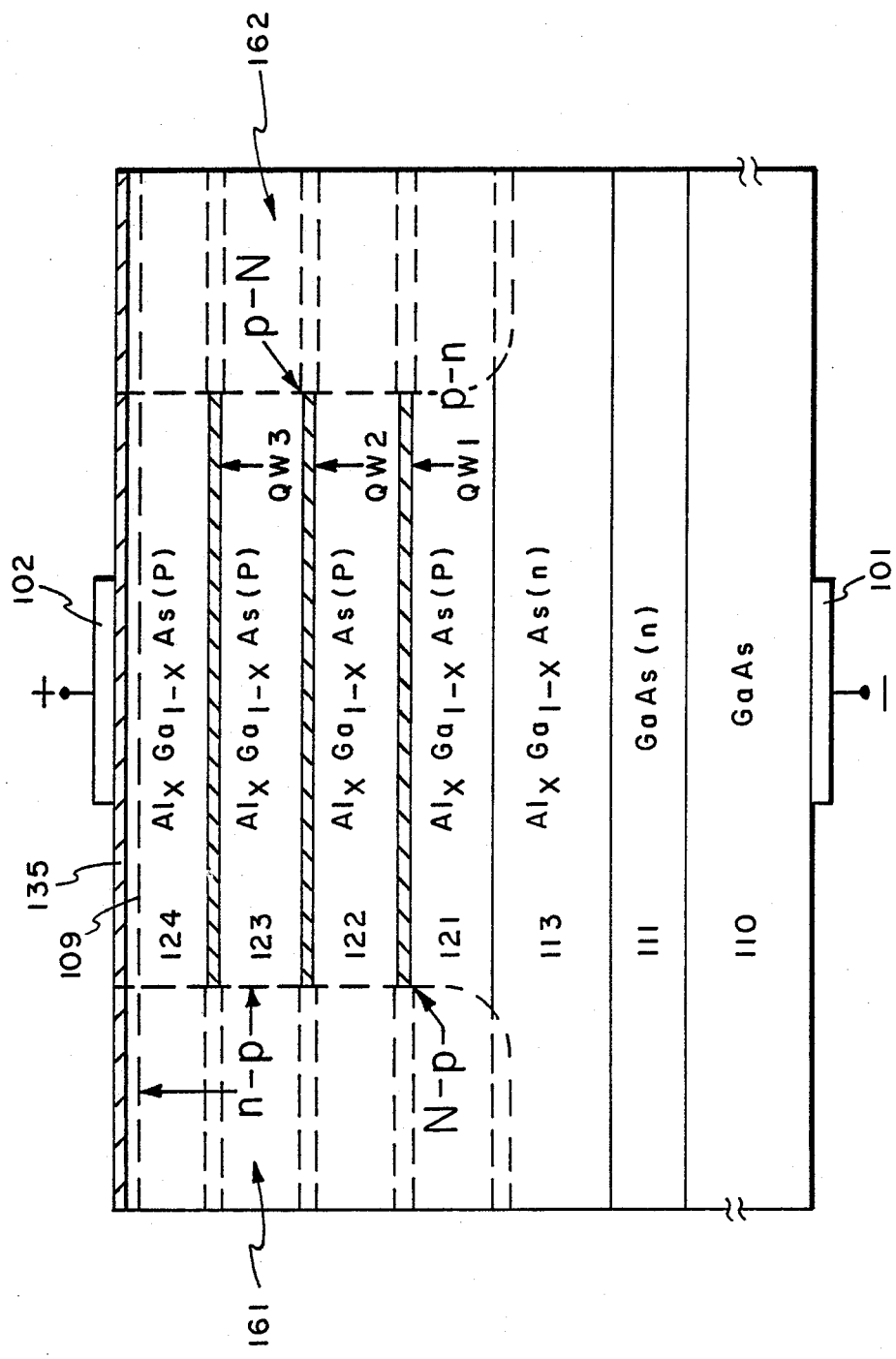
FIG. 1 is cross-sectional view of a device in accordance with an embodiment of the invention.

Referring to FIG. 1, there is shown a cross-sectional view of a device in accordance with an embodiment of the invention. The layers of the device can be grown, for example, using known metalorganic chemical vapor deposition techniques (see, for example, R. D. Dupuis et al., Proc. 7th Intl. Symp. on GaAs and Related Compounds, Inst. Physics, London, 1979; or M. Ludowise, J. Appl. Phys. 58, R31, 1985). In the illustration, a buried triple active region quantum well heterostructure is shown, but it will be understood that the number of the plurality of active regions can be selected as desired. From a substrate layer 110 upward, the epitaxial layers consist of an n-type GaAs buffer layer 111 (2 $\mu$m), an $Al_{0.4}Ga_{0.6}As$ n-type ($n_{se}$ about $10^{18}$ cm$^{-3}$) confining layer 113 (1.7 $\mu$m), an $Al_{0.4}Ga_{0.6}As$ p-type ($n_{Mg}$ about $10^{18}$ cm$^{-3}$) confining layer 121 (0.3 $\mu$m), the first of three multiple quantum well active regions QW1, an $Al_{0.4}Ga_{0.6}As$ p-type ($n_{Mg}$ about $10^{18}$ cm$^{-3}$) confining layer 122 (0.5 μm), a second multiple quantum well active region QW2 identical to QW1, an $Al_{0.4}Ga_{0.6}As$ p-type ($n_{Mg}$ about $10^{18}$ cm$^{-3}$) confining layer 123 (0.5 μm), a third multiple quantum well active region QW3 identical to QW1 and QW2, an upper $Al_{0.4}Ga_{0.6}As$ p-type ($n_{Mg}$ about $10^{18}$ cm$^{-3}$) confining layer 124 (0.4 μm), and a GaAs P+-type ($n_{Zn}$ about $10^{19}$ cm$^{-3}$) contact layer 135 (0.1 μm).

Figure 2:
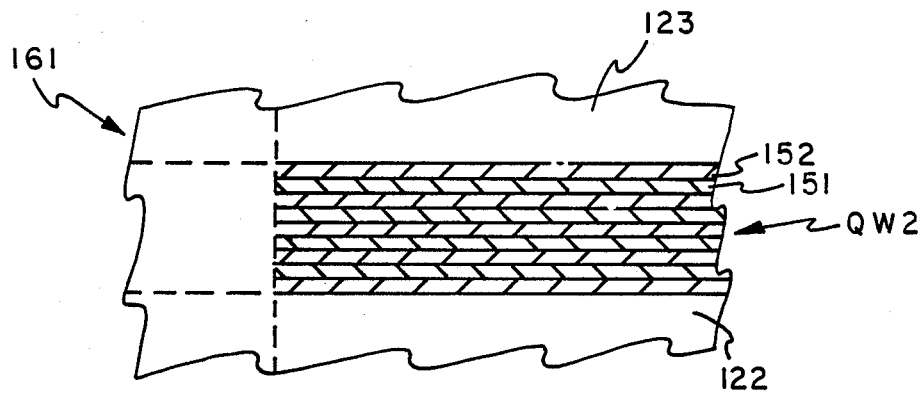
FIG. 2 shows an embodiment of the active region of the FIG. 1 structure.

In this embodiment, each of the three multiple quantum well active regions consists of four GaAs quantum wells 151 (each 100 Angstroms and slightly p-type) between five $Al_{0.2}Ga_{0.8}As$ barriers 152 (each 70 Angstroms), as shown in the blown-up region illustrated in FIG. 2. The number of quantum wells to be used, from one up, can be selected as appropriate. If desired, a Se doping spike can be grown at the center of each GaAs quantum well along with a Mg doping spike at the center of each $Al_{0.2}Ga_{0.8}As$ barrier, to enhance the carrier injection into the quantum wells.

In the illustrated embodiment of the invention, spaced apart edge regions 161 and 162, shown in dashed line in FIG. 1) are formed and contact respective edges of the previously described stack of layers. The regions 161 and 162 are formed by introducing an impurity (Si, in this case) which serves to render the effected portions of the stacked layers n-type, and which disorders the layers of the multiple quantum well regions (shown in dashed line within the edge regions) to form an alloy material having a higher bandgap than the materials of the original quantum well active layer. In this regard, reference can be made to U.S. Pat. Nos. 4,378,255 and 4,511,408, and to copending U.S. patent application Ser. No. 646,739, filed Aug. 31, 1984 now U.S. Pat. No. 4,639,275, all assigned to the same assignee as the present application. Also see D. G. Deppe et al., J. Appl. Phys. 58, 4515, 1985, for a further description of the technique, now called impurity induced layer disordering ("IILD"). In the present embodiment a Si diffusion is performed at 825 degrees for 34 h in order for the layer disordering and the n-type conversion to reach the lower $Al_{0.4}Ga_{0.6}As$ n-type confining layer 113.

A Zn diffusion, in the top region defined by dashed line 109, renders the top of the device p-type. Contacts 101 and 102 are respectively deposited on substrate 110 and on the GaAs contact layer 135, and the potential to be applied to contact 102 is shown as being positive with respect to contact 101.

In operation, because of the n-type gap conversion of the disordered quantum well material (shown in dashed line in regions 161 and 162 in FIG. 1) current injection occurs into the end of each active region QW1, QW2, and QW3. In particular, the energy gap change at the edges (i.e. the ends) of the three active regions allows a large portion of the operating current to be injected transversely into the three active regions. Some current is lost to the p-n homojunctions formed by the n-type Si diffusion and the p-type surroundings (see arrows in region 161 pointing to p-n junctions at interfaces with the confining layers and the p-type top layer). The preferred electron current path can be visualized as going from electrode 101 through n-type layers 110, 111 and 113, to the n-type edge regions 161 and 162, and then preferentially into the ends of the lower bandgap regions QW1, QW2 and QW3, where they recombine with holes entering the regions QW1, QW2, and QW3 via contact 102, layer 135, and the p-type central region.

Figure 4:
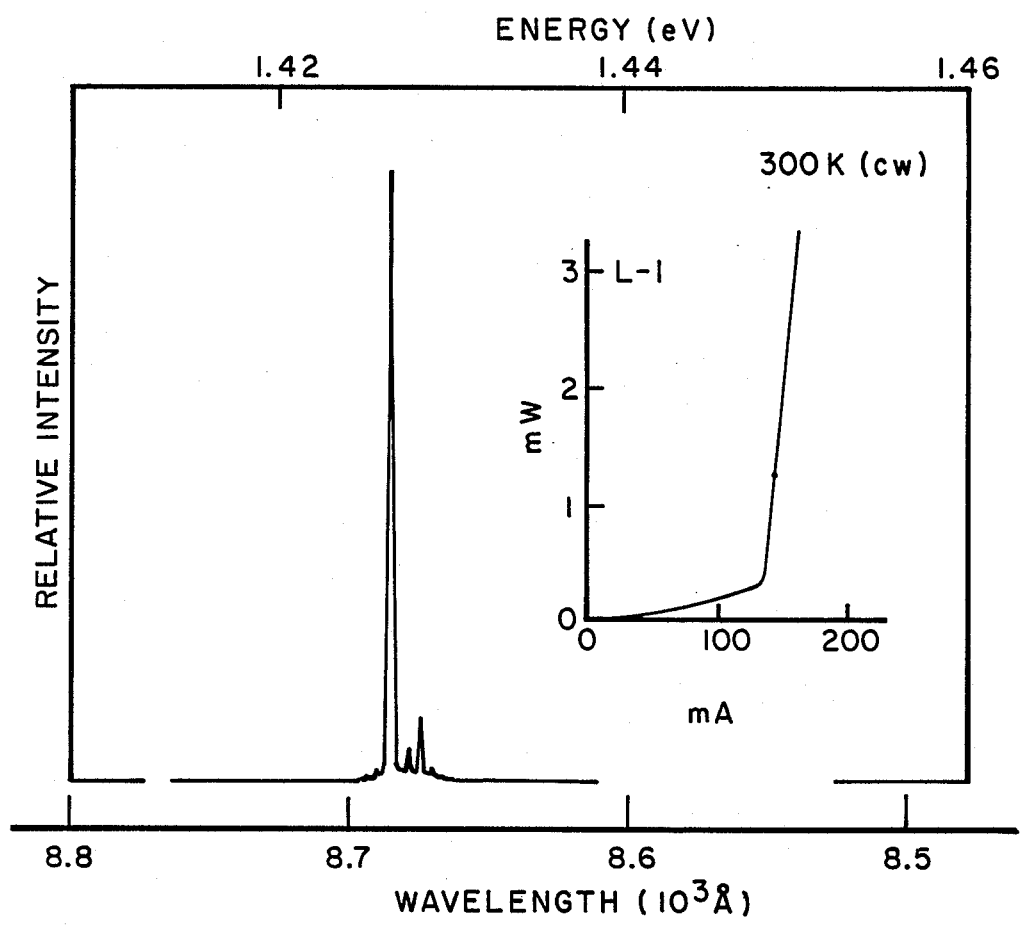
FIG. 4 shows continuous wave recombination radiation spectrum and light vs. current curves of an experimental device.
Figure 3:
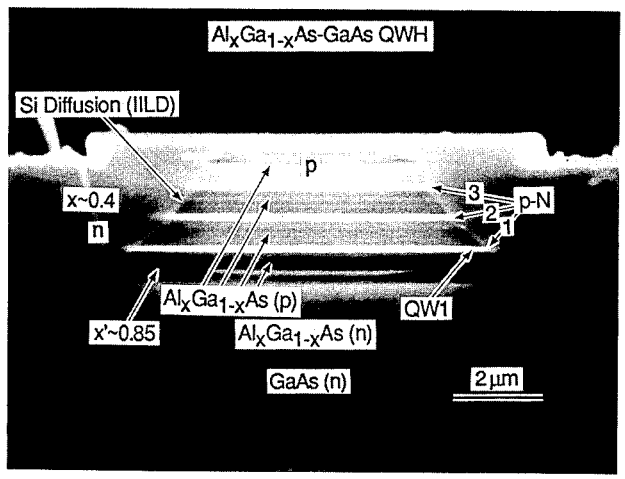
FIG. 3 shows a scanning electron microscope image of an experimental device.

An experimental device was fabricated as shown in FIG. 1, but which also had the following structural features: An n-type $Al_{0.2}Ga_{0.8}As$ buffer layer (0.3 μm) was deposited between layers 111 and 113, an undoped $Al_{0.85}Ga_{0.15}As$ current blocking layer (0.1 μm) was deposited between layers 113 and 121 (to prevent injection in through 121 for these measurements), and an $Al_{0.85}Ga_{0.85}As$ p-type ($n_{Mg}$ about $10^{18}$ cm$^{-3}$) transition layer was deposited between layers 124 and 135. Se and Mg doping spikes were used, as mentioned above. A scanning electron microscope image of the experimental device is shown in FIG. 3. The device shown was 7 um wide, and a 20 um wide oxide defined stripe diode was also fabricated on the same wafer, and used to characterize operation of the QW1 region alone. The "turn-on" voltage of the lower p-n junction (no stripe edges) is measured on the 20 μm wide oxide stripe devices to be 1.5 volts, while the "turn-on" voltage (at low current) of the edge-injecting p-n junctions (1,2,3) of FIG. 1 is much lower. The continuous wave (cw) recombination radiation spectrum and light vs. current (L-I) curves of the experimental Si-diffused device is shown in FIG. 4. The room temperature cw threshold is measured to be $I_{th}$=110 mA from the L-I curve, with single mode operation by about 112 mA. The spectrum at 125 mA shows single mode operation at a wavelength of 8685 Angstroms.

Figure 5:
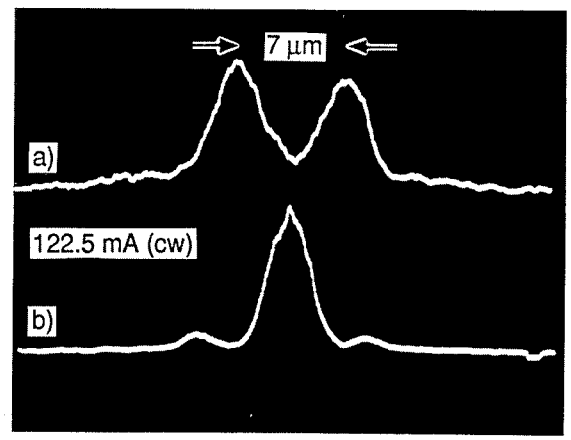
FIG. 5 shows near field intensity patterns of an experimental device.

Both the far-field (FF) radiation pattern and the near field (NF) intensity pattern have been measured at 122.5 mA (cw, single mode operation). Two NF intensity patterns of the 7 μm Si-diffused diode are shown in FIG. 5. A 25 mm focal length lens was used to image the diode's facet onto a linear CCD detector with a magnification of 74×. Since the current is injected into QW1, QW2, and QW3 from each edge of the Si diffusion boundary, it is expected that the laser will operate as two coupled but separate compound light emitters. Each emitter consists of the three vertically stacked multiple quantum well active regions at either Si diffusion boundary, and with the electron injection extending into the p-type multiple quantum well regions to some distance determined by the carrier diffusion length. In the vertical dimension the optical mode is not strongly confined to each active region but spreads out across all three. In addition, the resolution of the lens for this wavelength, about 1 μm, precludes separating the three active regions in the NF. This is, in fact, what is observed in (a) of FIG. 5 when the lens is positioned so that the uppermost active region, QW3, is focused on the detector. However, when the lens is positioned so that it images the lowermost active region QW1 on the detector, a strong signal is seen from the center of the active region. The large NF peak (b) of FIG. 5 is due to the grown-in high gap p-n junction 0.3 μm below QW1 that, at sufficient forward bias, injects electrons which diffuse into the p-region and are collected by QW1 and recombine. Weaker intensity peaks are observed on either side involving the edge injection regions as shown in (b) of FIG. 5. It can be noted that it should be possible to eliminate totally this excess current carrier injection into QW1, for example by introducing thin layers of alternating conductivity below QW1. In the experiment, however, the excess injection into QW1 is of some use in helping to understand and characterize edge injection.

Figure 6:
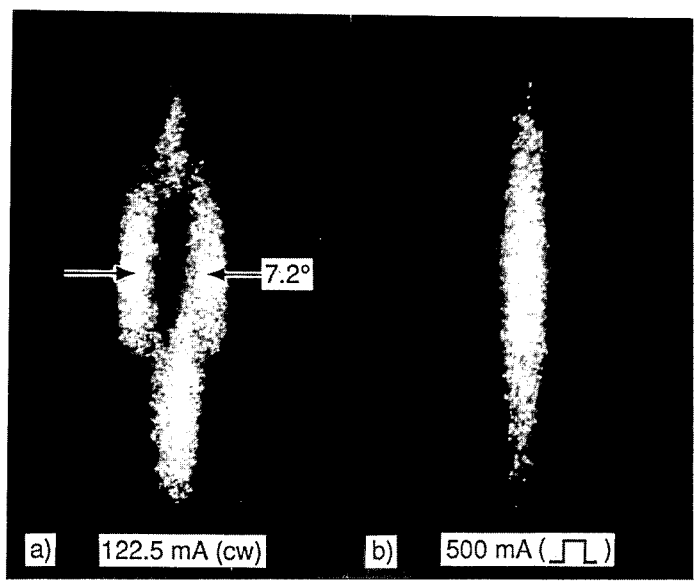
FIG. 6 shows far field intensity patterns of an experimental device.

Of particular importance is the FF radiation pattern [(a) of FIG. 6] of the edge injecting diode which, as noted above, operates single mode at 122.5 mA (cw). The two central symmetrical lobes are separated by 7°, and in the vertical direction have an angular spread ($\theta_\perp$)

of 15°. This pattern is expected from the two compound emitters (three vertical edge emitters) at either Si diffusion edge (about 7 μm spacing) operating coupled with 180° phase shift. [see, for example, M. Born et al., Principles of Optics, Pergamon Press, 1970, pp. 257–261.] The third lobe which is offset towards the bottom of the FF pattern is believed to be due to recombination radiation in the center of the diode from QW1. This source, which agrees with the NF source [(b) of FIG. 5] is also phase-coupled to the two edge-injecting emitters at the Si diffusion boundaries. The three-lobe pattern is stable to at least three times $I_{th}$ (pulsed operation).

For comparison, (b) of FIG. 6 shows the FF radiation pattern of the 20 μm oxide stripe diode (no Si diffusion or edge injection) with its operation due to electron injection into QW1 from the bottom grown-in p-n junction. For this diode to operate in stimulated emission the current is pulsed to 500 mA, 1% duty cycle. (At this high current cw operation is not possible). The vertical spread in the FF pattern, $\theta_\perp$, is greater than 45° for this structure, because the optical mode is supported by only a single narrow active region and not distributed by the stacked active regions (and edge injection).

It is expected that optimization of the horizontal spacing between the edge-injecting emitters to obtain zero-phase-shift coupling can be used to generate a single main lobe (0° in the FF pattern) instead of the twin lobe pattern of (a) in FIG. 6. The experiment shows that a significant improvement can be realized in $\theta_\perp$ (>45° to 15°) by stacking multiple active regions and utilizing edge injection. It will be understood that more active regions can be employed to reduce ($\theta_\perp$) further.

Figure 7:
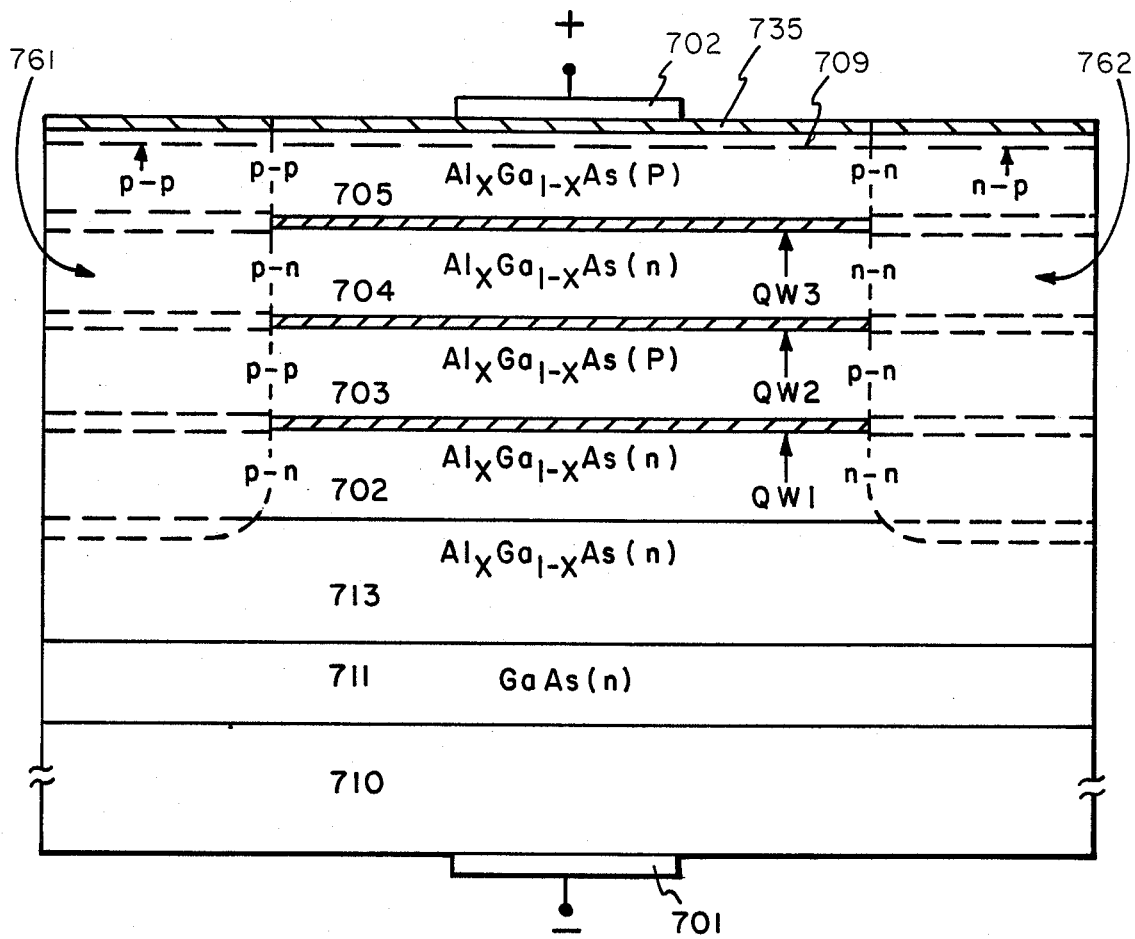
FIG. 7 is a cross-sectional view of a device in accordance with another embodiment of the invention.

Referring to FIG. 7, there is shown another embodiment of a semiconductor laser device with stacked active regions in accordance with the invention. In the embodiment of FIG. 7, the quantum well active layers, again designated QW1, QW2 and QW3, can be similar in structure to their counterparts in the FIG. 1 embodiment. Also, the substrate layer 710 and the GaAs layer 711 and $Al_xGa_{1-x}As$ layer 713 (optional) can be similar to their counterparts 110, 111, and 113 in FIG. 1. Confining layers 702, 703, 704 and 705 are provided. The confining layers 702 and 704 are n-type $Al_xGa_{1-x}As$ (with x, for example, in the range 0.4 to 0.8) and the confining layers 703 and 705 are p-type $Al_xGa_{1-x}As$ (with x again in the range, for example, 0.4 to 0.8).

In the embodiment of FIG. 7, the edge contact regions 761 and 762 are formed, for example, by diffusion, as in the FIG. 1 embodiment. As before, Si is used to form region 762 and render it n-type, but in this case Zn is diffused to form the region 761, and render it p-type. In the case of both of these diffusions, the element being diffused disorders the quantum well active regions with the effect of again obtaining disordered alloy material having a higher bandgap than either of the original materials of the quantum well active regions.

As in the FIG. 1 embodiment, a GaAs top contact layer 735 is provided and a top Zn diffusion is utilized, as indicated by the dashed line 709. Metallic contacts 701 and 702 are deposited on substrate 710 and contact layer 735, respectively.

In operation of the embodiment of FIG. 7, electron current from electrode 701 (coupled to a negative potential with respect to the electrode 702) flows through n-type layers 711 and 713 into the n-type edge region 762 and then into n-type confining regions 702 and 704. The electrons in confining region 702 are injected into the lower flat surface of active region QW1 and the electrons in confining layer 704 are injected into the upper flat surface of active region QW2 and the lower flat surface of active region QW3. Carrier vacancies (holes), on the other hand, can be visualized as traveling from electrode 702 through the p-type GaAs contact layer 735 into p-type diffused edge contact region 761, and then into p-type confining layers 703 and 705. (There is also a direct path into confining region 705. The holes in confining layer 703 are injected into the upper flat surface of active region QW1 and the lower flat surface of active region QW2, while the holes in confining layer 705 are injected into the upper flat surface of active region QW3. The holes and electrons in each active region combine and result in light emission which, above a certain threshold, provides phase-locked light emission from the active regions, and an output laser beam which can be expected to have a relatively high power (due to the described advantageous injection mechanism and the plurality of stacked active regions) as well as an expected relatively small value of $\theta_{195}$. In the described embodiment it is seen that the active regions are injected with carriers from both adjacent confining layers (electrons from one, and holes from the other). For example, active region QW2 will be receiving electrons via confining layer 704 and holes via confining layer 703.

Figure 8:
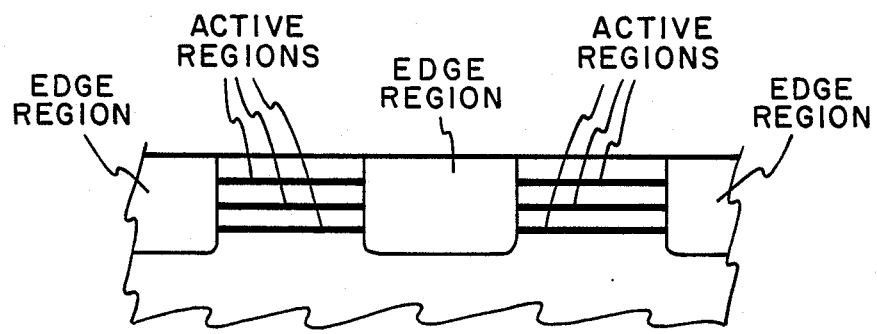
FIG. 8 is a simplified representation of an embodiment of an array of devices in accordance with the invention.

It will be understood that the devices as described herein can be advantageously utilized in side-by-side configurations so as to obtain two-dimensional arrays of light-emitting active regions which can form, for example, one or more laser beams. A layout is shown in FIG. 8, which represents two side-by-side devices of the type described above in conjunction with FIG. 1 or FIG. 7. The full detail of each device is not shown in this Figure, only the active regions and edge regions being illustrated. Each device is shown as having three active regions, so we have an array of 2×3 active regions. The individual layers can be grown as in the cases FIGS. 1 or 7, and the appropriate edge region diffusions, etc. implemented for the array (or more typically, for a group of arrays to be formed on a given wafer, and ultimately cleaved into a desired number of devices and/or arrays). If the individual devices of an array are of the form set forth in FIG. 1, then all the edge diffusions will be of a single conductivity type, whereas if the devices are of the type described in conjunction with FIG. 7, then the edge diffusions will alternate in conductivity type. In both cases, the edge diffusions other than those at the ends of the array can be "shared" between adjacent devices of the array.

The invention has been described with reference to particular preferred embodiments, but variations within the spirit and scope of the invention will occur to those skilled in the art. For example, alternative techniques can be employed for coupling the appropriate potentials to the edge regions and/or confining layers of the devices set forth. Also, the devices hereof have application as light emitters in general as well as lasers.

We claim:

1. A semiconductor laser device, comprising:
   a layered structure including a stack of alternating active regions and confining layers arranged so that each active region is sandwiched between confining layers; and
   carrier injection means for injecting carriers into said layered structure to cause phase locked light emission from said active regions said carrier injection means including spaced apart edge regions, each extending through said stack of active regions and confining layers so as to respectively contact opposing ends of the layers and regions of said stack.

2. The device as defined by claim 1, wherein each of said active regions comprises at least one quantum well layer.

3. The device as defined by claim 1, wherein each of said active regions comprises a plurality of alternating active layers and barrier layers, each active layer having barrier layers on both sides thereof.

4. The device as defined by claim 3, wherein said active layers are quantum well layers.

5. The device as defined by claim 1, wherein each of said active regions comprise alternating layers of gallium arsenide and aluminum gallium arsenide, and wherein said confining layers comprise aluminum gallium arsenide.

6. The device as defined by claim 3, wherein each of said active regions comprise alternating layers of gallium arsenide and aluminum gallium arsenide, and wherein said confining layers comprise aluminum gallium arsenide.

7. The device as defined by claim 4, wherein each of said active regions comprise alternating layers of gallium arsenide and aluminum gallium arsenide, and wherein said confining layers comprise aluminum gallium arsenide.

8. The device as defined by claim 5, wherein each of said edge regions includes extensions of said active regions having layer disordered material, the layer disordered material of said extensions having a higher bandgap than the material of said active regions.

9. The device as defined by claim 6, wherein each of said edge regions includes extensions of said active regions having layer disordered material, the layer disordered material of said extensions having a higher bandgap than the material of said active regions.

10. The device as defined by claim 7, wherein each of said edge regions includes extensions to said active regions having layer disordered material, the layer disordered material of said extensions having a higher bandgap than the material of said active regions.

11. The device as defined by claim 1, wherein said carrier injection means further includes means for applying a potential to said confining layers with respect to said edge regions.

12. The device as defined by claim 5, wherein said carrier injection means further includes means for applying a potential to said confining layers with respect to said edge regions.

13. The device as defined by claim 7, wherein said carrier injection means further includes means for applying a potential to said confining layers with respect to said edge regions.

14. A semiconductor light emitting device, comprising;
a layered semiconductor structure including a stack of active regions and confining layers arranged so that each active region is sandwiched between confining layers, said confining layers comprising semiconductor material of one conductivity type, and said active regions including semiconductor material having a lower bandgap than the bandgap of the confining layer semiconductor material;
a pair of spaced apart edge regions, extending through said stack of active regions and confining layers so as to respectively contact opposing ends of the layers and regions of said stack, said edge regions being of a second semiconductor type and having a bandgap that is higher than said semiconductor material of said active regions; and
means for applying a potential between said edge regions and said confining layers, whereby carriers are injected into the edges of said active regions from said edge regions, and light is emitted from said active regions.

15. The device as defined by claim 14, wherein each of said active regions comprise alternating layers of gallium arsenide and aluminum gallium arsenide, and wherein said confining layers comprise aluminum gallium arsenide.

16. The device as defined by claim 14, wherein each of said edge regions includes extensions of said active regions having layer disordered material, the layer disordered material of said extensions having a higher bandgap than the material of said active regions.

17. The device as defined by claim 15, wherein each of said edge regions includes extensions of said active regions having layer disordered material, the layer disordered material of said extensions having a higher bandgap than the material of said active regions.

18. The device as defined by claim 15, wherein said confining layers are p-type, and wherein said edge regions are n-type with an impurity introduced to render said edge regions n-type and to compositionally disorder the active regions extending into said edge regions.

19. The device as defined by claim 17, wherein said confining layers are p-type, and wherein said edge regions are n-type with an impurity introduced to render said edge regions n-type and to compositionally disorder the active regions extending into said edge regions.

20. The device as defined by claim 19, wherein said impurity is silicon.

21. The device as defined by claim 17, wherein said stack of layers further includes on one end thereof a semiconductor buffer layer of the same conductivity type as said edge regions, both of said edge regions extending into said semiconductor buffer layer, and on the other end thereof a contact layer of the same conductivity type as said confining layers, said potential being coupled between said buffer layer and said contact layer.

22. The device as defined by claim 14, wherein said light emitting device is a laser device, with said applied potential being sufficient to obtain phase-locked laser light emission from said active regions.

23. A semiconductor light emitting device, comprising;
a layered semiconductor structure including a stack of active regions and confining layers arranged so that each active region is sandwiched between confining layers, said confining layers comprising semiconductor material of alternating conductivity type, so that each active region has a p-type confining layer on one side thereof and an n-type confining layer on the other side thereof;
a pair of spaced apart edge regions, extending through said stack of active regions and confining layers so as to respectively contact opposing ends of the layers and regions of said stack, said two edge regions being of opposite conductivity type; and
means for applying a potential between said edge regions, whereby carriers are injected into the sides of each active region from the confining layers adjacent thereto.

24. The device as defined by claim 23, wherein each of said active regions comprise alternating layers of gallium arsenide and aluminum gallium arsenide, and wherein said confining layers comprise aluminum gallium arsenide.

25. The device as defined by claim 23, wherein said stack of layers further includes on one end thereof a semiconductor layer of the same conductivity type as one of said edge regions, both of said edge regions extending into said semiconductor end layer, and on the other end thereof a contact layer of the same conductivity type as the other of said edge regions, said potential being coupled between said end layer and said contact layer.

26. The device as defined by claim 24, wherein said stack of layers further includes on one end thereof a semiconductor buffer layer of the same conductivity type as one of said edge regions, both of said edge regions extending into said semiconductor buffer layer, and on the other end thereof a contact layer of the same conductivity type as the other of said edge regions, said potential being coupled between said buffer layer and said contact layer.

27. The device as defined by claim 23, wherein said light emitting device is a laser device, with said applied potential being sufficient to obtain phase-locked laser light emission from said active regions.

28. A semiconductor light emitting array, comprising:
a layered structure including a stack of alternating active regions and confining layers arranged so that each active region is sandwiched between confining layers;
said layered structure being divided laterally into a plurality of side-by-side devices;
carrier injection means for injecting carriers into said layered structure to cause light emission from the active regions of said devices said carrier injection means including a pair of edge regions for each device, each of said edge regions extending through said stack of active and confining layers; whereby light is emitted from a two-dimensional array of active layers.

* * * * *